US009603241B2

(12) United States Patent
Myung et al.

(10) Patent No.: US 9,603,241 B2
(45) Date of Patent: Mar. 21, 2017

(54) BACKPLATE FOR FOLDABLE DISPLAY DEVICE AND FOLDABLE DISPLAY DEVICE INCLUDING THE SAME

(71) Applicant: LG Display Co., Ltd., Seoul (KR)

(72) Inventors: Noh-Jin Myung, Paju-si (KR); Gee-Sung Chae, Incheon (KR); Joo-Hye Park, Anyang-si (KR); Sang-Hak Shin, Goyang-si (KR); Tae-Hyoung Kwak, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/979,561

(22) Filed: Dec. 28, 2015

(65) Prior Publication Data

US 2017/0034906 A1 Feb. 2, 2017

(30) Foreign Application Priority Data

Jul. 29, 2015 (KR) .......................... 10-2015-0107151

(51) Int. Cl.
*H05K 5/00* (2006.01)
*H05K 7/00* (2006.01)
*G06F 1/16* (2006.01)
*H05K 1/02* (2006.01)

(52) U.S. Cl.
CPC ......... *H05K 1/0281* (2013.01); *H05K 5/0017* (2013.01)

(58) Field of Classification Search
CPC ... H05K 5/0217; B32B 17/064; B29D 1/0074
USPC .............. 174/250–258; 349/63–65, 149–150
See application file for complete search history.

(56) References Cited

U.S. PATENT DOCUMENTS

| 2009/0284904 | A1* | 11/2009 | Wu | G02F 1/133305 361/679.01 |
| 2010/0289983 | A1* | 11/2010 | Rocard | B29D 11/0074 349/62 |
| 2012/0020056 | A1* | 1/2012 | Yamagata | G02F 1/133308 362/97.1 |
| 2012/0320509 | A1* | 12/2012 | Kim | B32B 17/064 361/679.01 |
| 2013/0321740 | A1* | 12/2013 | An | H05K 5/0217 349/58 |
| 2014/0065326 | A1* | 3/2014 | Lee | G06F 1/16 428/12 |
| 2015/0185782 | A1* | 7/2015 | Kim | G06F 1/1652 349/12 |

* cited by examiner

*Primary Examiner* — Tuan T Dinh
(74) *Attorney, Agent, or Firm* — Fenwick & West LLP

(57) ABSTRACT

A foldable display device comprises a display panel; and a backplate attached to a side of the display panel and including a hard layer and first and second soft layer attached on lower and upper surfaces of the hard layer, respectively, wherein the hard layer has a difference in a distance from a reference line in a center portion and a first edge portion.

19 Claims, 11 Drawing Sheets

BACKPLATE FOR FOLDABLE DISPLAY DEVICE AND FOLDABLE DISPLAY DEVICE INCLUDING THE SAME

CROSS-REFERENCE TO RELATED APPLICATION

The present application claims the benefit of Korean Patent Application No. 10-2015-0107151 filed in Korea on Jul. 29, 2015, which is hereby incorporated by reference herein in its entirety.

BACKGROUND OF THE INVENTION

Field of the Invention

The disclosure relates to a foldable display device and more particularly to a backplate for a foldable display device for preventing damage during folding-unfolding operation and a foldable display device including the backplate.

Discussion of the Related Art

As information technology and mobile communication technology have been developed, a display device for displaying a visual image has also been developed. Flat panel display devices, such as a liquid crystal display (LCD) device and an organic light emitting display (OLED) device, are developed and used.

In general, an LCD device includes a liquid crystal panel, which in turn, includes upper and lower substrates and a liquid crystal layer therebetween. The liquid crystal layer is driven by an electric field induced between a pixel electrode and a common electrode to display images.

The OLED device includes an emitting diode, which includes an anode, a cathode and an organic emitting layer therebetween, and holes and electrodes respectively from the anode and the cathode are combined and emits the light in the organic emitting layer to display images.

Recently, the needs for a foldable display device, which is fabricated by using a flexible substrate, are increased. The foldable display device is folded to be portable and is unfolded to display images. Namely, with the foldable display device, the large size image display can be provided, and portability of the display device is improved.

FIG. 1 is a schematic cross-sectional view of the related art foldable display device. As shown in FIG. 1, the foldable display device 10 includes a display panel 20, a backplate 30 and a cover window 40. The display panel 20 includes a flexible substrate 22, a display part 24 on the flexible substrate 22. For example, the flexible substrate 22 may be a polyimide substrate.

When the display panel 20 is an emitting diode panel, the display part 24 may include an emitting diode and a thin film transistor (TFT) for driving the emitting diode. The emitting diode may include an anode, which is connected to the TFT, an organic emitting layer on the anode, and a cathode on the organic emitting layer. In addition, an encapsulation film for preventing moisture penetration may cover the emitting diode.

On the other hand, when the display panel 20 is a liquid crystal panel, the display part 24 may include a thin film transistor (TFT) on the flexible substrate 22, a pixel electrode connected to the TFT, a counter substrate facing the flexible substrate 22, a common electrode on the flexible substrate 22 or the counter substrate, and a liquid crystal layer between the flexible substrate 22 and the counter substrate. The display panel 20 may further include a backlight unit.

With a carrier substrate (not shown) attached to a lower surface of the flexible substrate 22, elements such as the TFT are formed on the flexible substrate 22, and the carrier substrate is released to obtain the flexible display panel 20.

In the flexible display panel 20, since the flexible substrate 22 is too thin, the backplate 30 for supporting the display panel 20 is disposed under the flexible substrate 22. For example, the backplate 30 may be formed of polyethylene terephthalate (PET) and may be attached to the display panel 20 by an adhesive layer 32.

The cover window 40 is attached to an upper side of the display panel 20. The damage on the display panel 20 from outer impacts is prevented by the cover window 40. Although not shown, the cover window 40 may be attached to the display panel 20 by an adhesive layer.

In the related art foldable display device, the PET film having about 100 micrometers is used for the backplate 30. When the folding and unfolding operation is repeated in the foldable display device 10, the plastic deformation occurs in the backplate 30 such that the restoration of the folded display device to its original confirmation becomes difficult.

Namely, as shown in FIGS. 2A and 2B, since there is the plastic deformation problem in the backplate 30 (of FIG. 1) of the PET film, there are limitations in the folding and unfolding operation of the foldable display device 10. Namely, the folding and unfolding characteristic of the foldable display device 10 is deteriorated. FIG. 2A illustrates the backplate 30 plastic deformed such that the backplate 30 does not revert to its original shape when external force is removed. In FIG. 2B shows the result of plastic deformation of the backplate 30 after a repeated folding and unfolding where a center portion 54 is plastic deformed downward and two wing portions 52 are plastic deformed upward.

By reducing a thickness of the backplate 30, the plastic deformation problem in the backplate 30 may be decreased. However, the elastic restoring energy of the backplate 30 having the reduced thickness is decreased such that the time for the restoration of the folded display device is increased.

SUMMARY OF THE INVENTION

Embodiments relate to a foldable display device including a display panel and a backplate. The backplate is attached to a surface of the display panel to enhance resilience of the foldable display device. The backplate includes a first layer of first material having a first elastic modulus, a second layer of second material having a second elastic modulus, and a non-flat layer of third material having a third elastic modulus higher than the first elastic modulus and the second elastic modulus. The non-flat layer is between the first layer and the second layer.

In one embodiment, the first material is the same as the second material.

In one embodiment, the non-flat layer has a concave top surface of a predetermined radius of curvature and a convex bottom surface of the predetermined radius of curvature.

In one embodiment, the non-flat layer has a first inclined portion slanted downward towards a center line of the non-flat layer along which the backplate is bent, and a second inclined portion connected to the first inclined portion and slanted downwards towards the center.

In one embodiment, the non-flat layer includes a middle portion having a concave top surface and a convex bottom surface; and edge portions, each of the edge portions connected to an edge of the middle portion, each of the edge portions having a convex top surface and a concave bottom surface.

In one embodiment, the concave top surface and the convex bottom surface of the middle portion are curved, and the convex top surface and the concave bottom surface of each of the edge portions are curved.

In one embodiment, the concave top surface and the convex bottom surface of the middle portion comprise a plurality of flat surfaces, and the convex top surface and the concave bottom surface of each of the edge portions comprise a plurality of flat surfaces.

In one embodiment, the first layer has a flat top surface and a convex bottom surface, the flat top surface secured to the display panel and the convex bottom surface secured to a top surface of the non-flat layer.

In one embodiment, the first layer has a bottom surface of a profile that matches a profile of a top surface of the non-flat layer, and the second layer has a top surface of a profile that matches a profile of a bottom surface of the non-flat layer.

In one embodiment, the non-flat layer has a same thickness at different portions of the non-flat layer.

In one embodiment, the non-flat layer has a first thickness at a first location of the non-flat layer and a second thickness at a second location of the non-flat layer, the second thickness different from the first thickness.

In one embodiment, the non-flat layer is curved or bent towards a shape that results from plastic deformation of the non-flat layer by repeated folding and unfolding of the backplate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 3A:
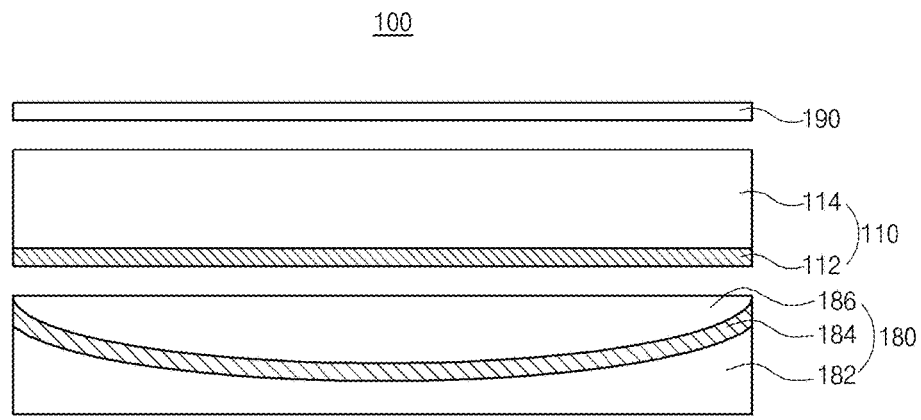
FIG. 3A is a schematic cross-sectional view of a foldable display device according to an embodiment.
Figure 3B:
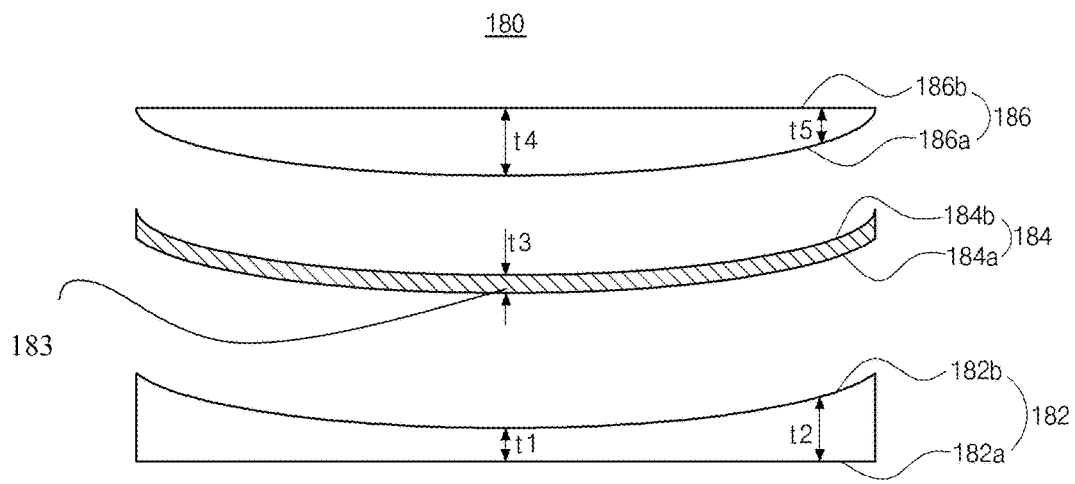
FIG. 3B is a schematic cross-sectional view of a backplate according to an embodiment of FIG. 3A.

FIG. 3A is a schematic cross-sectional view of a foldable display device according to an embodiment, and FIG. 3B is a schematic cross-sectional view of a backplate according to the embodiment of FIG. 3B.

As shown in FIGS. 3A and 3B, a foldable display device 100 includes a display panel 110, a backplate 180, which is disposed under the display panel 110 and includes a first soft layer 182, a hard layer 184 (also referred to as a "non-flat layer" herein) and a second soft layer 186, and a cover window 190 disposed on the display panel 110. The display panel 110 includes a flexible substrate 112 and a display part 114 on the flexible substrate 112. For example, the flexible substrate 112 may be a polyimide substrate.

The process of forming the display part 114 is performed on the flexible substrate 112 while the flexible substrate 112 is attached to a carrier substrate (not shown) such as a glass substrate. After the process of forming the display part 114, the carrier substrate and the flexible substrate 112 are separated or released to obtain the display panel 110.

Figure 1:
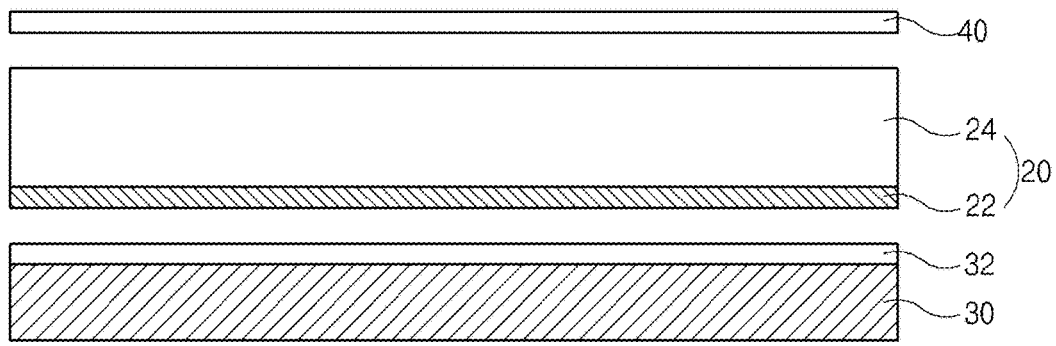
FIG. 1 is a schematic cross-sectional view of a foldable display device in related art.
Figure 2A:
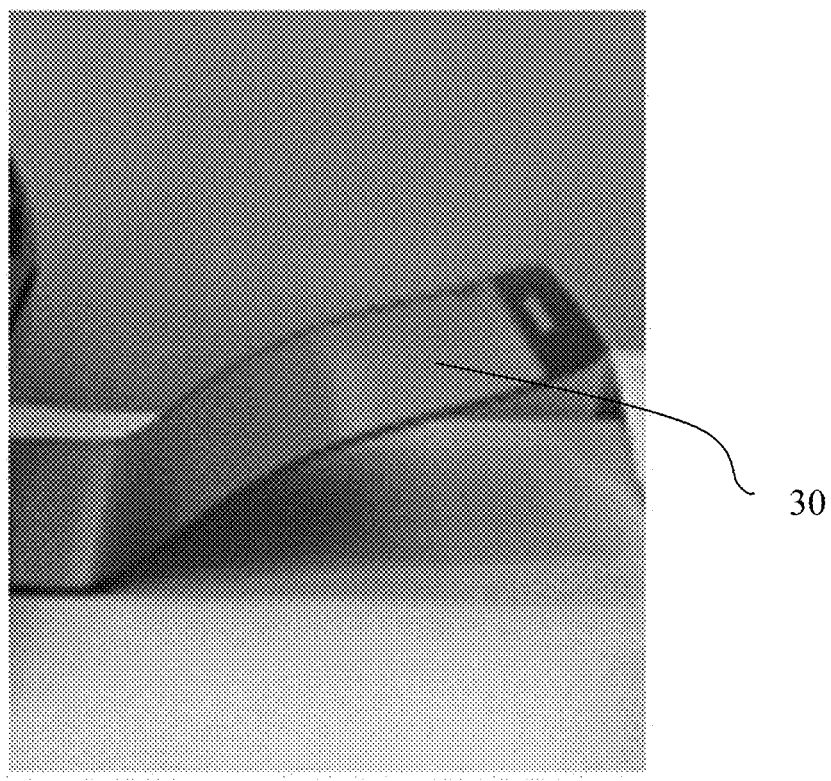
FIGS. 2A and 2B are views showing a plastic deformation issue in the backplate of related art.
Figure 2B:
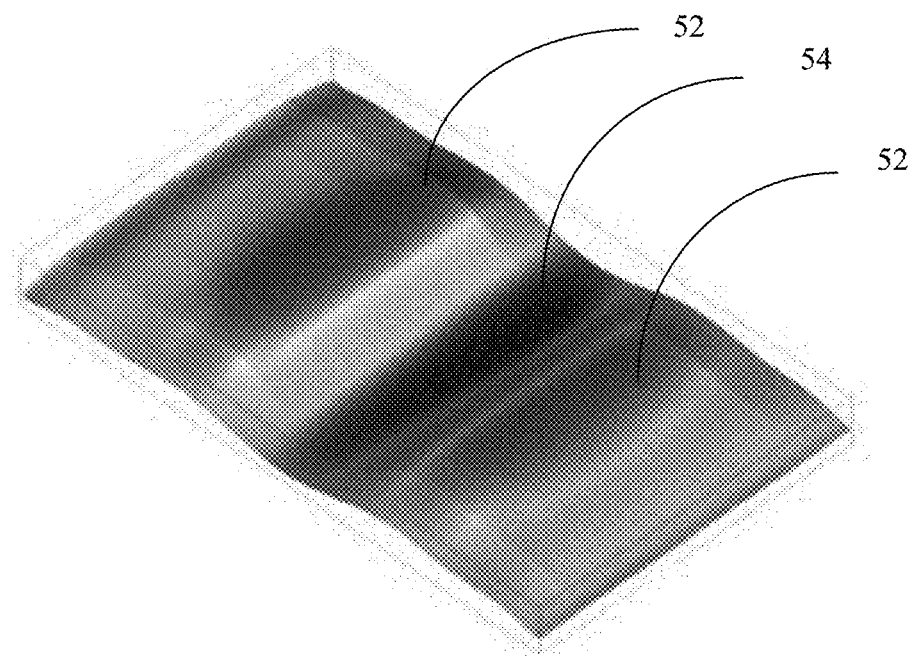

A shown in FIGS. 3A and 3B, the center portion 183 of the hard layer 184 is curved downward. As shown in FIG. 2B, downward plastic deformation tends to appear along the center portion of the back cover 30. Therefore, the hard layer 184 is pre-formed with downward curve in the center portion 183 so as to prevent downward plastic deformation from occurring.

Figure 4A:
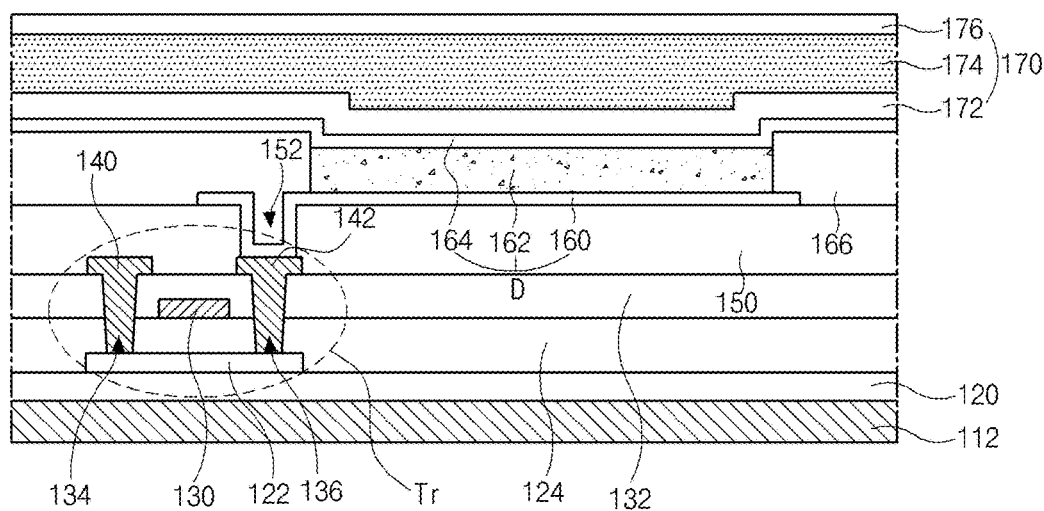
FIGS. 4A and 4B are schematic cross-sectional views of display panels according to embodiments.
Figure 4B:
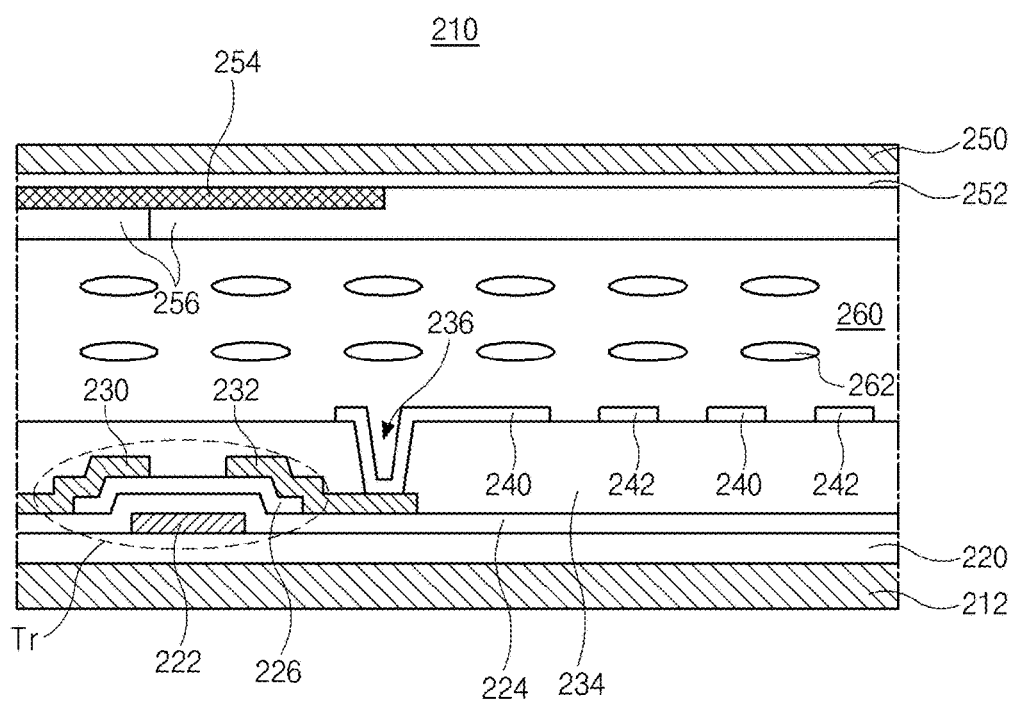

FIGS. 4A and 4B are schematic cross-sectional views of display panel according to an embodiment. As shown in FIG. 4A, the display panel 110 may be an emitting diode panel.

A buffer layer 120 is formed on the flexible substrate 112, and a thin film transistor (TFT) Tr is formed on the buffer layer 120. The buffer layer 120 may be omitted.

A semiconductor layer 122 is formed on the buffer layer 120. The semiconductor layer 122 may include an oxide semiconductor material or polycrystalline silicon. When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 4A, the gate insulating layer 124 is formed on the entire surface of the flexible substrate 112. Alternatively, the gate insulating layer 124 may be patterned to have the same shape as the gate electrode 130.

An interlayer insulating layer 132, which is formed of an insulating material, is formed on an entire surface of the flexible substrate 112 including the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

In FIG. 4A, the first and second contact holes 134 and 136 extend into the gate insulating layer 124. Alternatively, when the gate insulating layer 124 is patterned to have the same shape as the gate electrode 130, there may be no first and second contact holes 134 and 136 in the gate insulating layer 124.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr, and the TFT Tr serves as a driving element.

In FIG. 4A, the gate electrode 130, the source electrode 140 and the drain electrode 142 are positioned over the semiconductor layer 122. Namely, the TFT Tr has a coplanar structure. Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the flexible substrate 112 and cross each other to define a pixel region. In addition, a switching element, which is electrically connected to the gate line and the data line, may be disposed on the flexible substrate 112. The switching element is electrically connected to the TFT Tr as the driving element.

In addition, a power line, which is parallel to and spaced apart from the gate line or the data line, may be formed on or over the flexible substrate 112. Moreover, a storage capacitor for maintaining a voltage of the gate electrode 130 of the TFT Tr during one frame, may be further formed on the flexible substrate 112.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the display panel 110 is operated in a top-emission type, a reflection electrode or a reflection layer may be formed under the first electrode 160. For example, the reflection electrode or the reflection layer may be formed of aluminum-paladium-copper (APC) alloy.

A bank layer 166, which covers edges of the first electrode 160, is formed on the passivation layer 150. A center of the first electrode 160 in the pixel region is exposed through an opening of the bank layer 166.

An organic emitting layer 162 is formed on the first electrode 160. The organic emitting layer 162 may have a single-layered structure of an emitting material layer formed of an emitting material. Alternatively, to improve emitting efficiency, the organic emitting layer 162 may have a multi-layered structure including a hole injection layer, a hole transporting layer, the emitting material layer, an electron transporting layer and an electron injection layer sequentially stacked on the first electrode 160.

A second electrode 164 is formed over the flexible substrate 112 including the organic emitting layer 162. The second electrode 164 is positioned at an entire surface of the display area. The second electrode 164 may be a cathode and may be formed of a conductive material having a relatively low work function. For example, the second electrode 164 may be formed of aluminum (Al), magnesium (Mg) or Al—Mg alloy.

The first electrode 160, the organic emitting layer 162 and the second electrode 164 constitute the light emitting diode D. An encapsulation film 170 is formed on the light emitting diode D to prevent penetration of moisture into the light emitting diode D.

The encapsulation film 170 may have has a triple-layered structure of a first inorganic layer 172, an organic layer 174 and a second inorganic layer 176. However, it is not limited thereto.

A polarization plate (not shown) may be disposed on the encapsulation film 170 to reduce an ambient light reflection. The polarization plate may be a circular polarization film.

On the other hand, as shown in FIG. 4B, a liquid crystal panel 210 may be used for the display panel 110. The liquid crystal panel 210 includes first and second flexible substrates 212 and 250, which face each other, and a liquid crystal layer 260, which includes liquid crystal molecules 262, therebetween.

A first buffer layer 220 is formed on the first flexible substrate 212, and a TFT Tr is formed on the first buffer layer 212. The first buffer layer 220 may be omitted.

A gate electrode 222 is formed on the first buffer layer 220, and a gate insulating layer 224 is formed on the gate electrode 222. In addition, a gate line (not shown), which is connected to the gate electrode 222, is formed on the first buffer layer 220.

A semiconductor layer 226 corresponding to the gate electrode 222 is formed on the gate insulating layer 224. The semiconductor layer 226 may include an oxide semiconductor material. Alternatively, the semiconductor layer may include an active layer of intrinsic amorphous silicon and an ohmic contact layer of impurity-doped amorphous silicon.

A source electrode 230 and a drain electrode 232 spaced apart from each other are formed on the semiconductor layer 226. In addition, a data line (not shown), which is electrically connected to the source electrode 230 and crosses the gate line to define a pixel region, is formed.

The gate electrode 222, the semiconductor layer 226, the source electrode 230 and the drain electrode 232 constitute the TFT Tr.

A passivation layer 234, which includes a drain contact hole 236 exposing the drain electrode 232, is formed on the TFT Tr.

A pixel electrode 240, which is connected to the drain electrode 232 through the drain contact hole 236, and a common electrode 242, which is alternately arranged with the pixel electrode 240, are formed on the passivation layer 234.

A second buffer layer 252 is formed on the second flexible substrate 250, and a black matrix 254, which shields a non-display region such as the TFT Tr, the gate line and the data line, is formed on the second buffer layer 252. In addition, a color filter layer 256, which corresponds to the pixel region, is formed on the second buffer layer 252. The second buffer layer 252 and the black matrix 254 may be omitted.

The first and second flexible substrates 212 and 250 are attached with the liquid crystal layer 260 therebetween. The liquid crystal molecules 262 of the liquid crystal layer 260 is driven by an electric field between the pixel and common electrode 240 and 242.

Although not shown, first and second alignment layers may be formed over the first and second flexible substrates 212 and 250 to be adjacent to the liquid crystal layer 260. In addition, first and second polarization plates, which have perpendicular transmission axes, may be attached to an outer side of each of the first and second flexible substrates 212 and 250. Moreover, a flexible backlight unit may be disposed under the first flexible substrate 212 to provide light.

Referring again to FIGS. 3A and 3B, the backplate 180 is disposed under the display panel 110 such that the display panel 110 is supported by the backplate 180. For example, the backplate 180 may be attached to the flexible substrate 112 using an adhesive layer (not shown).

The backplate 180 includes the first and second soft layers 182 and 186 and the hard layer 184 between the first and second soft layers 182 and 186. Namely, the backplate 180 has a triple-layered structure.

Alternatively, the backplate 180 may further include another soft layer and/or another hard layer. For example, at least one of the first and second soft layers 182 and 186 and the hard layer 184 may have a double-layered structure including two different material layers.

The hard layer 184 includes a material having a Young's modulus value (i.e., elastic modulus value) larger than that of the first and second soft layers 182 and 186. Namely, the hard layer 184 has a high stiffness than the first and second soft layers 182 and 186. For example, each of the first and second soft layers 182 and 186 may have the modulus value of about 1 to about 20 MPa, and the hard layer 184 may have the modulus value of about 10 to about 100 GPa.

Each of the first and second soft layers 182 and 186 may be formed of one of polyurethane (PU), thermoplastic polyurethane (TPU), polyaramide (PA), rubber and silicon (Si). The hard layer 184 may be formed of a metal (e.g., stainless-steel (SUS)) or a polymer (e.g., polymethylmetacrylate (PMMA), polycarbonate (PC), polyvinylalcohol (PVA), acrylonitrile-butadiene-styrene (ABS), polyethylene terephthalate (PET)).

The second soft layer 186 is closer to the display panel 110 than the first soft layer 182 and the hard layer 184. Namely, the second soft layer 186 is positioned between the display panel 110 and the hard layer 184.

A lower surface 182a of the first soft layer 182 is flat, and an upper surface 182b of the first soft layer 182 has a curved shape. Namely, with respect to a horizontal plane, the upper surface 182b of the first soft layer 182 has a downwardly concave shape.

Accordingly, the first soft layer 182 has a first thickness t1 at a center portion and a second thickness t2, which is larger than the first thickness t1, at an edge portion.

Since the first soft layer 182 is at the bottom of the display device 100, it is preferred that the lower surface 182a of the first soft layer 182 is flat. However, the shape of the lower surface 182a is not limited thereto.

The hard layer 184 is disposed on the upper surface 182b of the first soft layer 182 and has a curved shape. Namely, a center portion of the hard layer 184 and an edge portion of the hard layer 184 have a difference in a distance from a reference line, e.g., the lower surface 182a of the first soft layer 182. The center portion of the hard layer 184 may have a first distance from the reference line, and the edge portion of the hard layer 184 may have a second distance, which is larger than the first distance, from the reference line.

With respect to a horizontal plane, a lower surface 184a of the hard layer 184 has a downwardly convex shape. The upper surface 182b of the first soft layer 182 and the lower surface 184a of the hard layer 184 may have substantially the same curvature. Accordingly, the entire lower surface 184a of the hard layer 184 and the entire upper surface 182b of the first soft layer 182 may come into contact with each other.

With respect to the horizontal plane, an upper surface 184b of the hard layer 184 has a downwardly concave shape. The upper surface 184b of the hard layer 184 and the lower surface 184a of the hard layer 184 may have the same curvature such that the hard layer 184 may have a substantially uniform third thickness t3 at a center portion and an edge portion.

Alternatively, the upper surface 184b of the hard layer 184 and the lower surface 184a of the hard layer 184 may have a difference in a curvature such that the hard layer 184 may have a thickness deviation. In other words, the lower surface 184a of the hard layer 184 has a first curvature along a first direction, i.e., a direction to the first soft layer 182, and the upper surface 184b of the hard layer 184 has a second curvature, which is different from the first curvature, along the first direction.

The second soft layer 186 is positioned on the upper surface 184b of the hard layer 184. An upper surface 186b of the second soft layer 186 is flat, and a lower surface 186a of the second soft layer 186 has a curved shape. In other words, with respect to a horizontal plane, the lower surface 186a of the second soft layer 186 has a downwardly convex shape. Accordingly, the second soft layer 186 has a fourth thickness t4 at a center portion and a fifth thickness t5, which is smaller than the fourth thickness t4, at an edge portion.

The lower surface 186a of the second soft layer 186 may have substantially the same curvature as the upper surface 184b of the hard layer 184. Accordingly, the lower surface 186a of the second soft layer 186 and the upper surface 184b of the hard layer 184 may entirely contact.

In FIG. 3B, the upper surface 182b of the first soft layer 182, the lower and upper surfaces 184a and 184b of the hard layer 184 and the lower surface 186a of the second soft layer 186 have the same curvature. Alternatively, the upper surface 182b of the first soft layer 182 and the lower surface 184a of the hard layer 184 may have a first curvature, and the upper surface 184b of the hard layer 184 and the lower surface 186a of the second soft layer 186 may have a second curvature being different from the first curvature.

The hard layer 184 has a relatively thin thickness such that the restoring property of the backplate 180 is improved. In other words, the third thickness t3 of the hard layer 184 is smaller than the second thickness t2 at the edge portion of the first soft layer 182 and the fourth thickness t4 at the center portion of the second soft layer 186.

Since the second soft layer 186 is a uppermost element of the backplate 180, it is preferred that the upper surface 186b of the second soft layer 186 is flat. However, the shape of the upper surface 186b of the second soft layer 186 is not limited thereto.

Since the backplate 180 includes the hard layer 184 having a high modulus value, the backplate 180 has a high restoring force of the backplate 180. Accordingly, despite a reduced thickness, the restoring property of the backplate 180 is improved.

However, when the backplate 180 has a single layer of a high modulus value material, the folding stress is concentrated on the backplate 180 such that there is a problem in the restoration of the backplate 180, i.e., the unfolding operation. Namely, since an elastic deformation region of the hard layer 184, which is formed of a high modulus value material, is narrow, the restoration of the hard layer 184 after the folding operation is very difficult. Accordingly, the backplate 180 is not unfolded after being folded and instead retains the unfolded shape.

However, the backplate 180 includes not only the hard layer 184 but also the first and second soft layers 182 and 186, and each of the first and second soft layers 182 and 186 has a thickness deviation. Namely, the hard layer 184 has a curved shape such that the folding stress is reduced and the restoring property of the backplate 180 is improved.

For example, when the foldable display device is folded, the length of the display device is increased such that the folding stress is concentrated on a center portion of the backplate. However, since the hard layer 184 has the curved shape with increased length compared to a flat configuration, the bending stress is distributed over a wider area of the hard layer 184. Accordingly, the folding stress in the center portion of the hard layer 184 is reduced, and the restoring property of the backplate 180 is improved.

In addition, the backplate 180 has a flat bottom surface and a flat top surface due to the configuration of the first and second soft layers 182 and 186, the combination with other elements and the stability of the fabricating process are secured.

The cover window 190 protects the display panel 110 from outer impacts and prevents damages (e.g., scratches) on the display panel 110. The cover window 190 may be omitted.

Although not shown, a touch panel may be disposed between the display panel 110 and the cover window 190. On the other hand, the foldable display device 100 including the backplate 180, where the hard layer 184 has a downwardly curved shape, is folded toward the display panel 110. Alternatively, when the foldable display device 100 is folded toward the backplate 180, the hard layer 184 of the backplate 180 may have an upwardly curved shape. In this instance, the first soft layer 182 may have larger thickness in a center portion than an edge portion, and the second soft layer 186 may have larger thickness in an edge portion than a center portion.

As mentioned above, since the foldable display device 100 includes the backplate 180 including the hard layer 184 having a curved shape and the first and second soft layers 182 and 186 attached to opposite sides of the hard layer 184, the restoring force the foldable display device 100 is increased. Accordingly, a thin foldable display device 100 with enhanced folding and unfolding properties is provided.

Figure 5A:
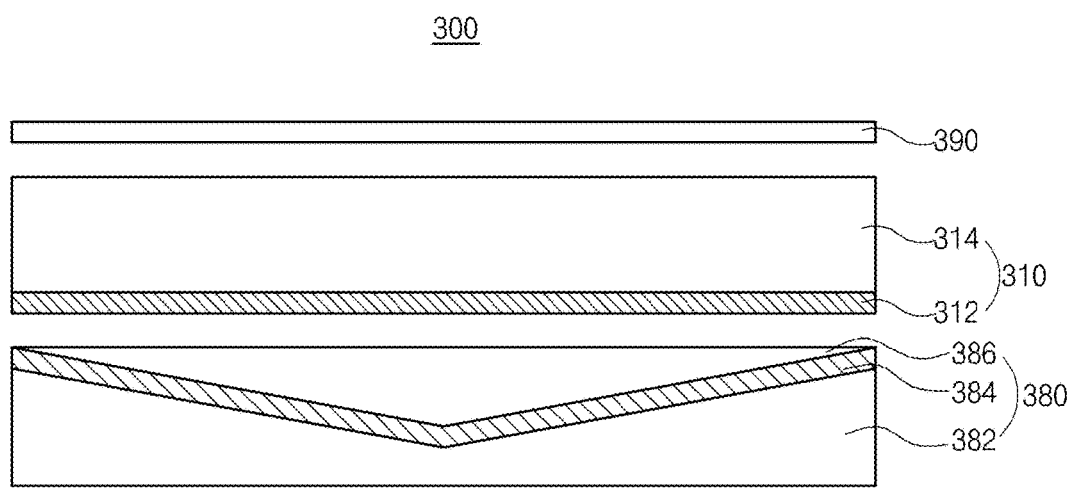
FIG. 5A is a schematic cross-sectional view of a foldable display device according to an embodiment.
Figure 5B:
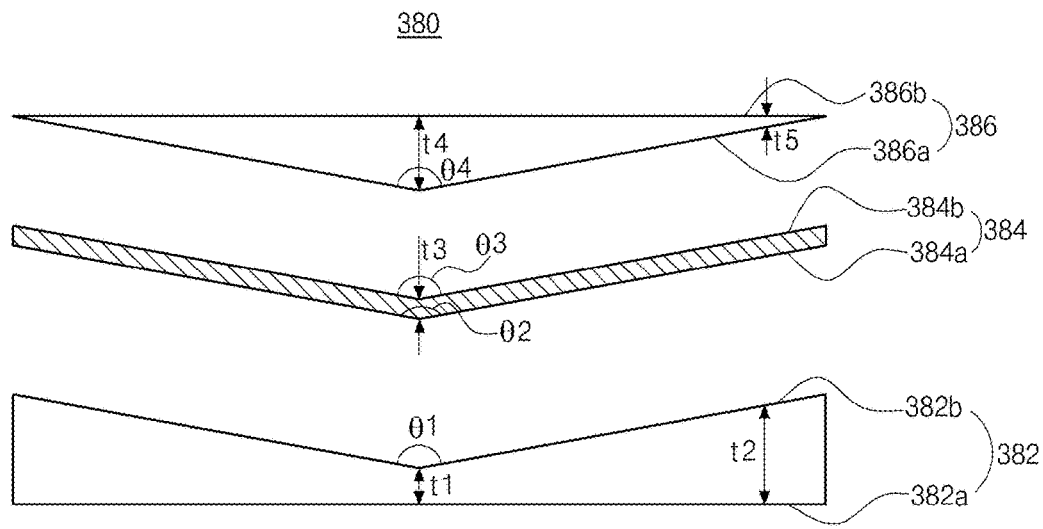
FIG. 5B is a schematic cross-sectional view of a backplate according to the embodiment of FIG. 5A.

FIG. 5A is a schematic cross-sectional view of a foldable display device according to an embodiment. FIG. 5B is a schematic cross-sectional view of a backplate according to the embodiment of FIG. 5A. As shown in FIGS. 5A and 5B, a foldable display device 300 includes a display panel 310, a backplate 380, and a cover window 390 disposed on the display panel 310. The backplate 380 is disposed under the display panel 310 and includes a first soft layer 382, a hard layer 384 (also referred to as a "non-flat layer" herein) and a second soft layer 386.

The display panel 310 includes a flexible substrate 312 and a display part 314 on the flexible substrate 312. For example, the flexible substrate 312 may be a polyimide substrate, and the display panel 310 may be an emitting diode panel or a liquid crystal panel.

When the display panel 310 is used as the emitting diode panel, as shown in FIG. 4A, the display panel 310 may include the TFT Tr as a driving element and an emitting diode D. On the other hand, when the display panel 310 is the liquid crystal panel, as shown in FIG. 4B, the display panel 310 may includes the first and second flexible substrates 212 and 250, the liquid crystal layer 260 therebetween, the pixel electrode 240 and the common electrode 242.

Referring again to FIGS. 5A and 5B, the backplate 380 is disposed under the display panel 310 such that the display panel 310 is supported by the backplate 380. For example, the backplate 380 may be attached to the flexible substrate 312 using an adhesive layer (not shown).

The backplate 380 includes the first and second soft layers 382 and 386 and the hard layer 384 between the first and second soft layers 382 and 386. Namely, the backplate 380 has a triple-layered structure.

Alternatively, the backplate 380 may further include another soft layer and/or another hard layer. For example, at least one of the first and second soft layers 382 and 386 and the hard layer 384 may have a double-layered structure including two different material layers.

The hard layer 384 includes a material having a modulus value larger than that of the first and second soft layers 382, 386. Other than the shape of the hard layer 384, the hard layer 384 is substantially the same as the hard layer 184. Similarly, the first and second soft layers 382, 386 are substantially the same as the first and second soft layers 182, 186. Therefore, detailed description on properties and material of the hard layer 384, the first soft layer 382 and the second layer 386 are omitted herein for the sake of brevity.

A lower surface 382a of the first soft layer 382 is flat, and an upper surface 382b of the first soft layer 382 has a first "V" shape. Accordingly, the first soft layer 382 has a first thickness t1 at a center portion and a second thickness t2, which is larger than the first thickness t1, at an edge portion.

Since the first soft layer 382 is at the bottom of the display device 300, it is preferred that the lower surface 382a of the first soft layer 382 is flat. However, the shape of the lower surface 382a is not limited thereto.

The hard layer 384 is disposed on the upper surface 382b of the first soft layer 382 and has a second "V" shape. Namely, a center portion of the hard layer 384 and an edge portion of the hard layer 384 have a difference in a distance from a reference line, e.g., the lower surface 382a of the first soft layer 382. The center portion of the hard layer 384 may have a first distance from the reference line, and the edge portion of the hard layer 384 may have a second distance, which is larger than the first distance, from the reference line.

The upper surface 382b of the first soft layer 382 and the lower surface 384a of the hard layer 384 may have the same inner angle. Namely, the upper surface 382b of the first soft layer 382 has a first inner angle θ1, and the lower surface 384a of the hard layer 384 has a second inner angle θ2 being equal to the first inner angle θ1. Accordingly, the lower surface 384a of the hard layer 384 and the upper surface 382b of the first soft layer 382 entirely contact.

An upper surface 384b of the hard layer 384 has a third "V" shape. The upper surface 384b of the hard layer 384 has the same inner angle as the lower surface 384a of the hard layer 384 such that the hard layer 384 has a substantially uniform thickness, i.e., a third thickness t3, in the center portion and the edge portion. Namely, the upper surface 384b of the hard layer 384 has a third inner angle θ3 substantially equal to the second inner angle θ2 of the lower surface 384a of the hard layer 384.

Alternatively, the upper surface 384b of the hard layer 384 and the lower surface 384a of the hard layer 384 may have a different inner angle such that there may be a thickness deviation in the hard layer 384.

The second soft layer 386 is positioned on the upper surface 384b of the hard layer 384. An upper surface 386b of the second soft layer 386 is flat, and a lower surface 386a of the second soft layer 386 has a fourth "V" shape. Accordingly, the second soft layer 386 has a fourth thickness t4 at the center portion and a fifth thickness t5, which is smaller than the fourth thickness t4, at the edge portion.

The lower surface 386a of the second soft layer 386 has substantially the same inner angle as the upper surface 384b of the hard layer 384. Namely, the lower surface 386a of the second soft layer 386 has a fourth inner angle θ4 substantially equal to the third inner angle θ3 of the upper surface 384b of the hard layer 384. Accordingly, the entire lower surface 386a of the second soft layer 386 and the entire upper surface 384b of the hard layer 384 come into contact with each other.

In FIG. 5, the upper surface 382b of the first soft layer 382, the lower and upper surfaces 384a and 384b of the hard layer and the lower surface 386a of the second soft layer 386 have the same inner angle.

Alternatively, the upper surface 382b of the first soft layer 382 and the lower surface 384a of the hard layer 384 may have the same inner angle, and the upper surface 384b of the hard layer 384 and the lower surface 386a of the second soft layer 386 may have the same inner angle being different from the inner angle of the upper surface 382b of the first soft layer 382 and the lower surface 384a of the hard layer 384.

In addition, the upper surface 382b of the first soft layer 382 and the lower surface 384a of the hard layer 384 may have the "V" shape as FIG. 5B, while the upper surface 384b of the hard layer 384 and the lower surface 386a of the second soft layer 386 may have the curved shape as shown in FIG. 3B. Alternatively, the upper surface 382b of the first soft layer 382 and the lower surface 384a of the hard layer 384 may have the curved shape as FIG. 3B, while the upper surface 384b of the hard layer 384 and the lower surface 386a of the second soft layer 386 may have the "V" shape as shown in FIG. 5B.

The hard layer 384 has a relatively thin thickness such that the restoring property of the backplate 380 is improved. In other words, the third thickness t3 of the hard layer 384 is smaller than the second thickness t2 at the edge portion of the first soft layer 382 and the fourth thickness t4 at the center portion of the second soft layer 386.

Since the second soft layer 386 is an uppermost element of the backplate 380, it is preferred that the upper surface 386b of the second soft layer 386 is flat. However, the shape of the upper surface 386b of the second soft layer 386 is not limited thereto.

As mentioned above, the backplate 380 includes the hard layer 384 having a high modulus value, and the first and second soft layers 382 and 386, which are attached to the lower and upper surfaces 384a and 384b of the hard layer 384, respectively, have the thickness deviation. Namely, the hard layer 384 has the "V" shape such that the folding stress of the backplate 380 is reduced and the restoring property of the backplate 380 is improved.

In addition, the backplate 380 has a flat bottom surface and a flat top surface due to the first and second soft layers 382 and 386, the combination with other elements and the stability of the fabricating process are secured.

The cover window 390 protects the display panel 310 from outer impacts and prevents damages, e.g., scratches, on the display panel 310. The cover window 390 may be omitted.

Although not shown, a touch panel may be disposed between the display panel 310 and the cover window 390.

On the other hand, the foldable display device 300 including the backplate 380, where the hard layer 384 has the "V" shape, is folded toward the display panel 310. As shown above with reference to FIG. 2B, downward plastic deformation tends to appear along the center portion of the back cover. Therefore, the hard layer 384 is pre-formed with "V" shape at the center so as to prevent downward plastic deformation from occurring. Because the center portion is pre-formed with a downward shape, the center portion of the hard layer 384 is less likely to experience further plastic deformation by repeated folding and unfolding of the back cover 380.

Alternatively, when the foldable display device 300 is folded toward the backplate 380, the hard layer 384 of the backplate 380 may have a reverse "V" shape. In this instance, the first soft layer 382 may have larger thickness in the center portion than the edge portion, and the second soft layer 386 may have larger thickness in the edge portion than the center portion.

As mentioned above, since the foldable display device 300 includes the backplate 380 including the hard layer 184 having the "V" shape and the first and second soft layers 382 and 386 attached to opposite sides of the hard layer 384, the restoring force the foldable display device 300 is increased. Accordingly, a thin foldable display device 300 with enhanced folding and unfolding properties is provided.

Figure 6A:
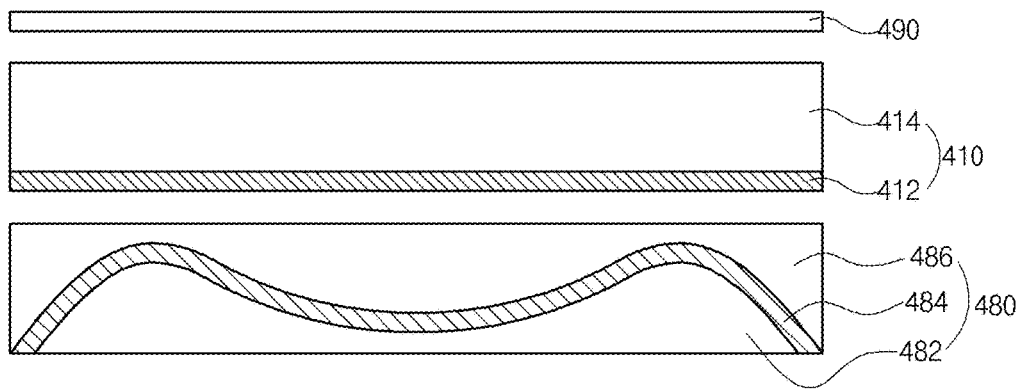
FIG. 6A is a schematic cross-sectional view of a foldable display device according to an embodiment.
Figure 6B:
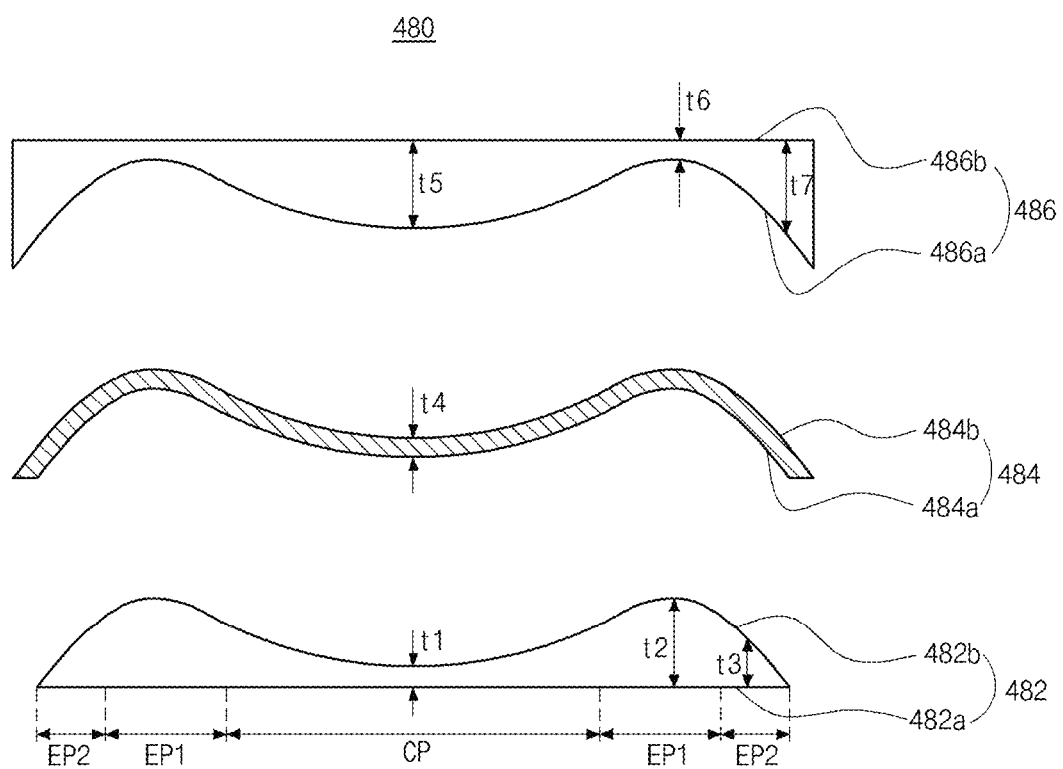
FIG. 6B is a schematic cross-sectional view of a backplate according to the embodiment of FIG. 6A.

FIG. 6A is a schematic cross-sectional view of a foldable display device according to an embodiment. FIG. 6B is a schematic cross-sectional view of a backplate according to FIG. 6A. As shown in FIGS. 6A and 6B, a foldable display device 400 includes a display panel 410, a backplate 480, and a cover window 490 disposed on the display panel 410. The backplate 480 is disposed under the display panel 410 and includes a first soft layer 482, a hard layer 484 (also referred to as a "non-flat layer" herein) and a second soft layer 486.

The display panel 410 includes a flexible substrate 412 and a display part 414 on the flexible substrate 412. For example, the flexible substrate 412 may be a polyimide substrate, and the display panel 410 may be an emitting diode panel or a liquid crystal panel.

When the display panel 410 is the emitting diode panel, as shown in FIG. 4A, the display panel 410 may include the TFT Tr as a driving element and an emitting diode D. On the other hand, when the display panel 410 is the liquid crystal panel, as shown in FIG. 4B, the display panel 410 may includes the first and second flexible substrates 212 and 250, the liquid crystal layer 260 therebetween, the pixel electrode 240 and the common electrode 242.

Referring again to FIGS. 6A and 6B, the backplate 480 is disposed under the display panel 410 such that the display panel 410 is supported by the backplate 480. For example, the backplate 480 may be attached to the flexible substrate 412 using an adhesive layer (not shown).

The backplate 480 includes the first and second soft layers 482 and 486 and the hard layer 484 between the first and second soft layers 482 and 486. Namely, the backplate 480 has a triple-layered structure.

Alternatively, the backplate 480 may further include another soft layer and/or another hard layer. For example, at least one of the first and second soft layers 482 and 486 and the hard layer 484 may have a double-layered structure including two different material layers.

The hard layer 484 includes a material having a modulus value larger than that of the first and second soft layers 482 and 486. Other than the shape of the hard layer 484, the hard layer 484 is substantially the same as the hard layer 184. Similarly, the first and second soft layers 482, 486 are substantially the same as the first and second soft layers 182, 186. Therefore, detailed description on properties and material of the hard layer 484, the first soft layer 482 and the second layer 486 are omitted herein for the sake of brevity.

The second soft layer 486 is closer to the display panel 410 than the first soft layer 482 and the hard layer 484. Namely, the second soft layer 486 is positioned between the display panel 410 and the hard layer 484.

A lower surface 482a of the first soft layer 482 is flat, and an upper surface 482b of the first soft layer 482 has a curved shape. Namely, with respect to a horizontal plane, the upper surface 482b of the first soft layer 482 has a downwardly concave shape in a center portion CP and an upwardly convex shape in a first edge portion EP1.

Accordingly, the first soft layer 482 has a first thickness in the center portion CP, a second thickness t2, which is larger than the first thickness t1, in the first edge portion EP1, and a third thickness t3, which is smaller than the second thickness t2, in a second edge portion EP2 at an outer side of the first edge portion EP1.

Since the first soft layer 482 is at the bottom of the display device 400, it is preferred that the lower surface 482a of the first soft layer 482 is flat. However, the shape of the lower surface 482a is not limited thereto.

The hard layer 484 is disposed on the upper surface 482b of the first soft layer 482 and has a curved shape. A lower surface 484a of the hard layer 484 has a downwardly convex shape in the center portion CP and an upwardly concave shape in the first edge portion EP1.

Namely, in the center portion CP, the lower surface 484a of the hard layer 484 has a first curvature along a first direction, i.e., a direction to the first soft layer 482, and an upper surface 484b of the hard layer 484 has a second curvature, which is equal to or different from the first curvature, along the first direction. In addition, in the first edge portion EP1, the lower surface 484a of the hard layer 484 has a third curvature along a second direction, which is opposite to the first direction, i.e., a direction to the second soft layer 486, and the upper surface 484b of the hard layer 484 has a fourth curvature, which is equal to or different from the third curvature, along the second direction.

In other words, the hard layer 484 has a difference in a distance from a reference line, e.g., the lower surface 482a of the first soft layer 482. For example, from the reference line, a distance of the hard layer 484 in the center portion CP and the second edge portion EP2 may be smaller than that of the hard layer 484 in the first edge portion EP1.

The upper surface 482b of the first soft layer 482 and the lower surface 484a of the hard layer 484 may have substantially the same curvature. Accordingly, the entire lower surface 484a of the hard layer 484 and the entire upper surface 482b of the first soft layer 482 may come into contact with each other.

The upper surface 484b of the hard layer 484 has a downwardly concave shape in the center portion CP and an upwardly convex shape in the first edge portion EP1.

The upper surface 484b of the hard layer 484 and the lower surface 484a of the hard layer 484 may have the same curvature such that the hard layer 484 may have a substantially uniform fourth thickness t4 at the center portion CP and the first and second edge portions EP1 and EP2.

Alternatively, the upper surface 484b of the hard layer 484 and the lower surface 484a of the hard layer 484 may have a difference in a curvature such that the hard layer 484 may have a thickness deviation.

The second soft layer 486 is positioned on the upper surface 484b of the hard layer 484. An upper surface 486b of the second soft layer 486 is flat, and a lower surface 486a of the second soft layer 486 has a curved shape.

The lower surface 486a of the second soft layer 486 has a downwardly convex shape in the center portion CP and an upwardly concave shape in the first edge portion EP1. Accordingly, the second soft layer 486 has a fifth thickness in the center portion CP, a sixth thickness t6, which is smaller than the fifth thickness t5, in the first edge portion EP1, and a seventh thickness t7, which is larger than the sixth thickness t6, in the second edge portion EP2 at an outer side of the first edge portion EP1.

The lower surface 486a of the second soft layer 486 may have substantially the same curvature as the upper surface 484b of the hard layer 484. Accordingly, the lower surface 486a of the second soft layer 486 and the upper surface 484b of the hard layer 484 may contact over their entire surfaces.

In FIG. 6B, the upper surface 482b of the first soft layer 482, the lower and upper surfaces 484a and 484b of the hard layer 484 and the lower surface 486a of the second soft layer 486 have the same curvature. Alternatively, the upper surface 482b of the first soft layer 482 and the lower surface 484a of the hard layer 484 may have a first curvature, and the upper surface 484b of the hard layer 484 and the lower surface 486a of the second soft layer 486 may have a second curvature being different from the first curvature.

The hard layer 484 has a relatively thin thickness such that the restoring property of the backplate 480 is improved. In other words, the fourth thickness t4 of the hard layer 484 is smaller than the second thickness t2 at the first edge portion EP1 of the first soft layer 482 and the fifth thickness t5 at the center portion CP of the second soft layer 486.

Since the second soft layer 486 is an uppermost element of the backplate 480, it is preferred that the upper surface 486b of the second soft layer 486 is flat. However, the shape of the upper surface 486b of the second soft layer 486 is not limited thereto.

As mentioned above, the backplate 480 includes the hard layer 484 having a high modulus value, and the first and second soft layers 482 and 486, which are attached to the lower and upper surfaces 484a and 484b of the hard layer 484, respectively, have the thickness deviation. Namely, the hard layer 484 has a wave shape or a saw-tooth shape such that the folding stress of the backplate 480 is reduced and the restoring property of the backplate 480 is improved.

In other words, since the hard layer 484 has a downwardly curved shape in the center portion CP and an upwardly curved shape in the first edge portion EP1, a length increase in the center portion CP of the hard layer 484 by the folding operation is further reduced. Accordingly, the folding stress on the center portion CP of the hard layer 484 is further reduced, and the restoring property of the backplate 480 is further improved.

In addition, the backplate 480 has a flat bottom surface and a flat top surface due to the first and second soft layers 482 and 486, the combination with other elements and the stability of the fabricating process are secured.

The cover window 490 protects the display panel 410 from outer impacts and prevents damages, e.g., scratches, on the display panel 410. The cover window 490 may be omitted.

Although not shown, a touch panel may be disposed between the display panel 410 and the cover window 490.

On the other hand, the foldable display device 400 including the backplate 480, where the hard layer 484 has the downwardly curved shape in the center portion CP at a folding region, is folded toward the display panel 410.

Alternatively, when the foldable display device 400 is folded toward the backplate 480, the hard layer 484 of the backplate 480 may have an upwardly curved shape in the center portion CP. In this instance, the hard layer 484 may have a downwardly curved shape in the first edge portion EP1. Moreover, the first soft layer 482 may have larger thickness in the center portion CP and the second edge portion EP2 than the first edge portion EP1, and the second soft layer 486 may have smaller thickness in the center portion CP and the second edge portion EP2 than the first edge portion EP1.

As mentioned above, since the foldable display device 400 includes the backplate 480 including the hard layer 484 having a curved shape, i.e., a wave shape or a taw-tooth shape, and the first and second soft layers 482 and 486 attached to opposite sides of the hard layer 484, the restoring force the foldable display device 400 is increased. Accordingly, a thin foldable display device 400 with enhanced folding and unfolding properties is provided. As shown above with reference to FIG. 2B, downward plastic deformation tends to appear along the center portion of the back cover. Therefore, the hard layer 484 is pre-formed with a downward curved center so as to prevent downward plastic deformation from occurring. Because the center portion is pre-formed with a downward shape, the center portion of the hard layer 484 is less likely to experience further plastic deformation by repeated folding and unfolding of the back cover 480.

Figure 7A:
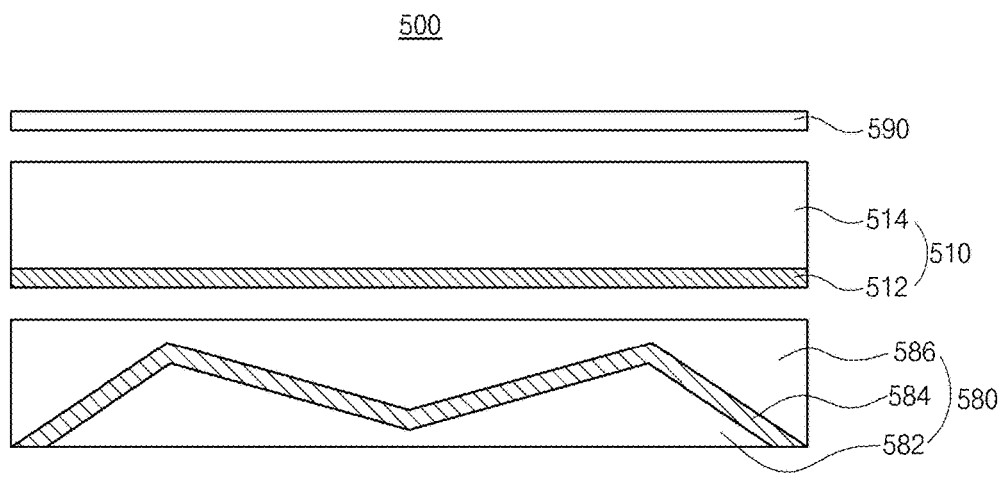
FIG. 7A is a schematic cross-sectional view of a foldable display device according to an embodiment.
Figure 7B:
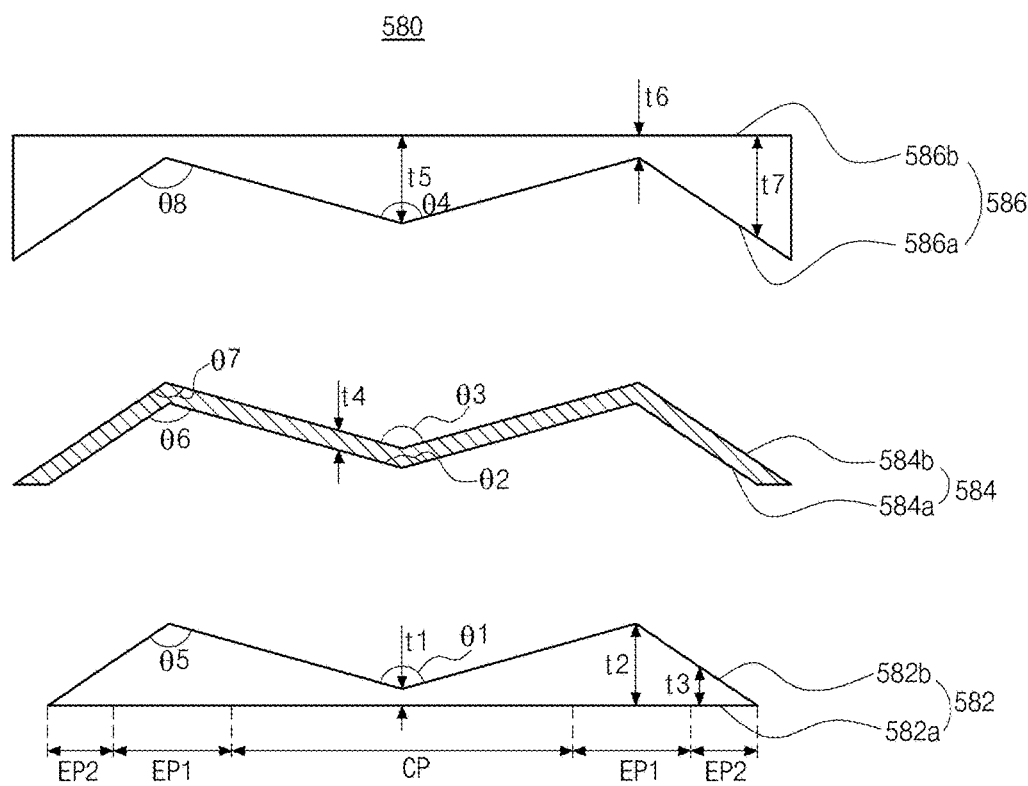
FIG. 7B is a schematic cross-sectional view of a backplate according to the embodiment of FIG. 7A.

FIG. 7A is a schematic cross-sectional view of a foldable display device according to an embodiment. FIG. 7B is a schematic cross-sectional view of a backplate of FIG. 7A.

As shown in FIGS. 7A and 7B, a foldable display device 500 includes a display panel 510, a backplate 580, and a cover window 590 disposed on the display panel 510. A backplate 580 is disposed under the display panel 510 and includes a first soft layer 582, a hard layer 584 (also referred to as a "non-flat layer" herein) and a second soft layer 586.

The display panel 510 includes a flexible substrate 512 and a display part 514 on the flexible substrate 512. For example, the flexible substrate 512 may be a polyimide substrate, and the display panel 510 may be an emitting diode panel or a liquid crystal panel.

When the display panel 510 is the emitting diode panel, as shown in FIG. 4A, the display panel 510 may include the TFT Tr as a driving element and an emitting diode D. On the other hand, when the display panel 510 is the liquid crystal panel, as shown in FIG. 4B, the display panel 510 may includes the first and second flexible substrates 212 and 250, the liquid crystal layer 260 therebetween, the pixel electrode 240 and the common electrode 242.

Referring again to FIGS. 7A and 7B, the backplate 580 is disposed under the display panel 510 such that the display panel 510 is supported by the backplate 580. For example, the backplate 580 may be attached to the flexible substrate 512 using an adhesive layer (not shown).

The backplate 580 includes the first and second soft layers 582 and 586 and the hard layer 584 between the first and second soft layers 582 and 586. Namely, the backplate 580 has a triple-layered structure.

Alternatively, the backplate 580 may further include another soft layer and/or another hard layer. For example, at least one of the first and second soft layers 582 and 586 and the hard layer 584 may have a double-layered structure including two different material layers.

The hard layer 584 includes a material having a modulus value larger than that of the first and second soft layers 582 and 586. Other than the shape of the hard layer 584, the hard layer 584 is substantially the same as the hard layer 184. Similarly, the first and second soft layers 582, 586 are substantially the same as the first and second soft layers 182, 186. Therefore, detailed description on properties and material of the hard layer 584, the first soft layer 582 and the second layer 586 are omitted herein for the sake of brevity.

The second soft layer 586 is closer to the display panel 510 than the first soft layer 582 and the hard layer 584. Namely, the second soft layer 586 is positioned between the display panel 510 and the hard layer 584.

A lower surface 582a of the first soft layer 582 is flat, and an upper surface 582b of the first soft layer 582 has a gull-like shape. Namely, the upper surface 582b of the first soft layer 582 has a "V" shape in a center portion CP and a reverse "V" shape in a first edge portion EP1.

Accordingly, the first soft layer 582 has a first thickness in the center portion CP, a second thickness t2, which is larger than the first thickness t1, in the first edge portion EP1, and a third thickness t3, which is smaller than the second thickness t2, in a second edge portion EP2 at an outer side of the first edge portion EP1.

Since the first soft layer 582 is at the bottom of the display device 500, it is preferred that the lower surface 582a of the first soft layer 582 is flat. However, the shape of the lower surface 582a is not limited thereto.

The hard layer 584 is disposed on the upper surface 582b of the first soft layer 582 and has a gull-like shape. A lower surface 584a of the hard layer 584 has a "V" shape in the center portion CP and a reverse "V" shape in the first edge portion EP1.

In other words, the hard layer 584 has a difference in a distance from a reference line, e.g., the lower surface 582a of the first soft layer 582. For example, from the reference line, a distance of the hard layer 584 in the center portion CP and the second edge portion EP2 may be smaller than that of the hard layer 584 in the first edge portion EP1.

The upper surface 582b of the first soft layer 582 and the lower surface 584a of the hard layer 584 may have substantially the same shape. Namely, in each of the center portion CP and the first edge portion EP1, an inner angle of the upper surface 582b of the first soft layer 582 may be equal to that of the lower surface 584a of the hard layer 584. ($\theta 1=\theta 2$, $\theta 5=\theta 6$) Accordingly, the entire lower surface 584a of the hard layer 584 and the entire upper surface 582b of the first soft layer 582 may come into contact with each other.

The upper surface 584b of the hard layer 584 and the lower surface 584a of the hard layer 584 may have the same gull-like shape. Namely, in each of the center portion CP and the first edge portion EP1, an inner angle of each of the lower and upper surfaces 584a and 584b of the hard layer 584 may be equal. ($\theta 2=\theta 3$, $\theta 6=\theta 7$) Accordingly, the hard layer 584 may have a substantially uniform fourth thickness t4 at the center portion CP and the first and second edge portions EP1 and EP2.

Alternatively, the upper surface 584b of the hard layer 584 and the lower surface 584a of the hard layer 584 may have a difference in an inner angle such that the hard layer 584 may have a thickness deviation.

The second soft layer 586 is positioned on the upper surface 584b of the hard layer 584. An upper surface 586b of the second soft layer 586 is flat, and a lower surface 586a of the second soft layer 586 has a gull-like shape. Accordingly, the second soft layer 586 has a fifth thickness in the center portion CP, a sixth thickness t6, which is smaller than the fifth thickness t5, in the first edge portion EP1, and a seventh thickness t7, which is larger than the sixth thickness t6, in the second edge portion EP2 at an outer side of the first edge portion EP1.

The lower surface 586a of the second soft layer 586 may have substantially the same inner angle as the upper surface 584b of the hard layer 584. Namely, in each of the center portion CP and the first edge portion EP1, an inner angle of the lower surface 586a of the second soft layer 586 may be equal to that of the upper surface 584b of the hard layer 584. (θ4=θ3, θ8=θ7) Accordingly, the entire lower surface 586a of the second soft layer 586 and the entire upper surface 584b of the hard layer 584 may come into contact with each other.

In FIG. 7B, the upper surface 582b of the first soft layer 582, the lower and upper surfaces 584a and 584b of the hard layer 584 and the lower surface 586a of the second soft layer 586 have the same inner angle. Alternatively, the upper surface 582b of the first soft layer 582 and the lower surface 584a of the hard layer 584 may have the same inner angle, and the upper surface 584b of the hard layer 584 and the lower surface 586a of the second soft layer 586 may have a different inner angel from the upper surface 582b of the first soft layer 582 and the lower surface 584a of the hard layer 584. (θ1=θ2, θ5=θ6, θ3=θ4, θ7=θ8, θ1≠θ3, θ5≠θ7)

In addition, the upper surface 582b of the first soft layer 582 and the lower surface 584a of the hard layer 584 may have the gull-like shape as FIG. 7B, and the upper surface 584b of the hard layer 584 and the lower surface 586a of the second soft layer 586 may have the wave shape or the taw-tooth shape as FIG. 6B. Alternatively, the upper surface 582b of the first soft layer 582 and the lower surface 584a of the hard layer 584 may have the wave shape or the taw-tooth shape as FIG. 6B, and the upper surface 584b of the hard layer 584 and the lower surface 586a of the second soft layer 586 may have the gull-like shape as FIG. 7B.

Moreover, each of the upper surface 582b of the first soft layer 582, the lower and upper surfaces 584a and 584b of the hard layer 584 and the lower surface 586a of the second soft layer 586 may an angular shape, i.e., the "V" shape, in the center portion CP as FIG. 7B and the curved shape in the first edge portion EP1 as FIG. 6B. Alternatively, each of the upper surface 582b of the first soft layer 582, the lower and upper surfaces 584a and 584b of the hard layer 584 and the lower surface 586a of the second soft layer 586 may the curved shape in the center portion CP as FIG. 6B and the angular shape, i.e., the "V" shape, in the first edge portion EP1 as FIG. 7B.

The hard layer 584 has a relatively thin thickness such that the restoring property of the backplate 580 is improved. In other words, the fourth thickness t4 of the hard layer 584 is smaller than the second thickness t2 at the first edge portion EP1 of the first soft layer 582 and the fifth thickness t5 at the center portion CP of the second soft layer 586.

Since the second soft layer 586 is a uppermost element of the backplate 580, it is preferred that the upper surface 586b of the second soft layer 586 is flat. However, the shape of the upper surface 586b of the second soft layer 586 is not limited thereto.

As mentioned above, the backplate 580 includes the hard layer 584 having a high modulus value, and the first and second soft layers 582 and 586, which are attached to the lower and upper surfaces 584a and 584b of the hard layer 584, respectively, have the thickness deviation. Namely, the hard layer 584 has a gull-like shape such that the folding stress of the backplate 580 is reduced and the restoring property of the backplate 580 is improved.

In other words, since the hard layer 584 has a "V" shape in the center portion CP and a reverse "V" shape in the first edge portion EP1, a length increase in the center portion CP of the hard layer 584 by the folding operation is further reduced. Accordingly, the folding stress on the center portion CP of the hard layer 584 is further reduced, and the restoring property of the backplate 580 is further improved.

As shown above with reference to FIG. 2B, downward plastic deformation tends to appear along the center portion of the back cover. Therefore, the hard layer 584 is pre-formed with "V" shape at the center so as to prevent downward plastic deformation from occurring. Because the center portion is pre-formed with a downward shape, the center portion of the hard layer 584 is less likely to experience further plastic deformation by repeated folding and unfolding of the back cover 580.

In addition, the backplate 580 has a flat bottom surface and a flat top surface due to the first and second soft layers 582 and 586, the combination with other elements and the stability of the fabricating process are secured.

The cover window 590 protects the display panel 510 from outer impacts and prevents damages, e.g., scratches, on the display panel 510. The cover window 590 may be omitted.

Although not shown, a touch panel may be disposed between the display panel 510 and the cover window 590.

On the other hand, the foldable display device 500 including the backplate 580, where the hard layer 584 has the "V" shape in the center portion CP at a folding region, is folded toward the display panel 510.

Alternatively, when the foldable display device 500 is folded toward the backplate 580, the hard layer 584 of the backplate 580 may have a reverse "V" shape in the center portion CP and a "V" shape in the first edge portion EP1. Moreover, the first soft layer 582 may have larger thickness in the center portion CP and the second edge portion EP2 than the first edge portion EP1, and the second soft layer 586 may have smaller thickness in the center portion CP and the second edge portion EP2 than the first edge portion EP1.

As mentioned above, since the foldable display device 500 includes the backplate 580 including the hard layer 584 having a gull-like shape, and the first and second soft layers 582 and 586 attached to opposite sides of the hard layer 584, the restoring force the foldable display device 500 is increased. Accordingly, a thin foldable display device 500 with excellent folding and unfolding properties is provided.

What is claimed is:

1. A foldable display device, comprising:
 a display panel having a bottom surface; and
 a backplate disposed at a first side of the display panel to enhance resilience of the foldable display device, the backplate comprising:
  a first layer of first material having a first elastic modulus, the first layer having a first top profile that matches a bottom profile of the display panel,
  a second layer of second material having a second elastic modulus, the second layer having a second top profile, and
  a non-flat layer of third material having a third elastic modulus higher than the first elastic modulus and the second elastic modulus, the non-flat layer between the first layer and the second layer, the non-flat layer having a top profile that matches a bottom profile of the first layer and a bottom profile that matches the second top profile of the second layer, the top profile and the bottom profile of the non-flat layer different from the first top profile of the first layer.

2. The foldable display device of claim 1, wherein the first material is same as the second material.

3. The foldable display device of claim 1, wherein the top profile of the non-flat layer is concaved with a predetermined radius of curvature and the bottom profile of the non-flat layer is convexed with the predetermined radius of curvature.

4. The foldable display device of claim 1, wherein the non-flat layer has a first inclined portion slanted downward towards a center line of the non-flat layer along which the backplate is bent, and a second inclined portion connected to the first inclined portion and slanted downwards towards the center line.

5. The foldable display device of claim 1, wherein the non-flat layer comprises:
   a middle portion having a concave top surface and a convex bottom surface; and
   edge portions, each of the edge portions connected to an edge of the middle portion, each of the edge portions having a convex top surface and a concave bottom surface.

6. The foldable display device of claim 1, wherein the first top profile is flat and the bottom profile of the first layer is convex.

7. The foldable display device of claim 1, wherein the non-flat layer has a same thickness at different portions of the non-flat layer.

8. The foldable display device of claim 1, wherein the non-flat layer has a first thickness at a first location of the non-flat layer and a second thickness at a second location of the non-flat layer.

9. The foldable display device of claim 1, wherein the non-flat layer is curved or bent towards a shape that results from plastic deformation of the non-flat layer by repeated folding and unfolding of the backplate.

10. The foldable display device of claim 1, wherein the display panel includes a light emitting diode, and wherein an image is displayed at a second side opposite to the first side.

11. The foldable display device of claim 5, wherein the concave top surface and the convex bottom surface of the middle portion are curved, and the convex top surface and the concave bottom surface of each of the edge portions are curved.

12. The foldable display device of claim 5, wherein the concave top surface and the convex bottom surface of the middle portion comprise a plurality of flat surfaces, and the convex top surface and the concave bottom surface of each of the edge portions are flat surfaces.

13. A backplate disposed at a side of a display panel to enhance resilience of the foldable display device, the backplate comprising:
   a first layer of first material having a first elastic modulus, the first layer having a first top profile that matches a bottom profile of the display panel,
   a second layer of second material having a second elastic modulus, the second layer having a second top profile, and
   a non-flat layer of third material having a third elastic modulus higher than the first elastic modulus and the second elastic modulus, the non-flat layer between the first layer and the second layer, the non-flat layer having a top profile that matches a bottom profile of the first layer and a bottom profile that matches the second top profile of the second layer, the top profile and the bottom profile of the non-flat layer different from the first top profile of the first layer.

14. The backplate of claim 13, wherein the top profile of the non-flat layer is concaved with a predetermined radius of curvature and the bottom profile of the non-flat layer is convexed with the predetermined radius of curvature.

15. The backplate of claim 13, wherein the non-flat layer has a first inclined portion slanted downward towards a center line of the non-flat layer along which the backplate is bent, and a second inclined portion connected to the first inclined portion and slanted downward towards the center line of the non-plat layer.

16. The backplate of claim 13, wherein the non-flat layer comprises:
   a middle portion having a concave top surface and a convex bottom surface; and
   edge portions, each of the edge portions connected to an edge of the middle portion, each of the edge portions having a convex top surface and a concave bottom surface.

17. The backplate of claim 13, wherein the first layer has a flat top surface and a convex bottom surface, the flat top surface secured to the display panel and the convex bottom surface secured to a top surface of the non-flat layer.

18. The backplate of claim 13, wherein the non-flat layer has a same thickness at different portions of the non-flat layer.

19. The backplate of claim 13, wherein the non-flat layer is curved or bent towards a shape that results from plastic deformation of the non-flat layer by repeated folding and unfolding of the non-flat layer.

* * * * *